(12) United States Patent
de Sandre

(10) Patent No.: US 7,286,381 B2
(45) Date of Patent: Oct. 23, 2007

(54) NON-VOLATILE AND-TYPE CONTENT ADDRESSABLE MEMORY

(75) Inventor: Guido de Sandre, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 60 days.

(21) Appl. No.: 11/355,419

(22) Filed: Feb. 16, 2006

(65) Prior Publication Data

US 2006/0139982 A1    Jun. 29, 2006

Related U.S. Application Data

(62) Division of application No. 10/676,731, filed on Oct. 1, 2003, now Pat. No. 7,031,177.

(30) Foreign Application Priority Data

Oct. 2, 2002    (IT)    .................. RM2002A0493

(51) Int. Cl.
*G11C 15/00*    (2006.01)
(52) U.S. Cl. .............. 365/49; 365/185.05; 365/185.24; 365/185.26

(58) Field of Classification Search ............... 365/49, 365/185.05, 185.24, 185.26, 185.07, 189.07, 365/189.08
See application file for complete search history.

(56) References Cited

U.S. PATENT DOCUMENTS

| 5,051,948 | A | 9/1991 | Watabe et al. ............. 365/49 |
| 5,111,427 | A | 5/1992 | Kobayashi et al. ........ 365/49 |
| 6,005,790 | A | 12/1999 | Chan et al. ............... 365/49 |
| 6,166,938 | A | 12/2000 | Wong ....................... 365/49 |
| 6,317,349 | B1 | 11/2001 | Wong ....................... 365/49 |
| 6,373,739 | B1 | 4/2002 | Lien et al. ................ 365/49 |
| 6,542,392 | B2 | 4/2003 | Yanagawa ................. 365/49 |
| 6,711,041 | B2 * | 3/2004 | Pereira et al. ............ 365/49 |
| 6,944,038 | B2 | 9/2005 | de Sandre ................ 365/49 |
| 2003/0028713 | A1 * | 2/2003 | Khanna et al. .......... 711/108 |

* cited by examiner

*Primary Examiner*—Anh Phung
*Assistant Examiner*—Toan Le
(74) *Attorney, Agent, or Firm*—Lisa K. Jorgenson; E. Russell Tarleton; Seed IP Law Group PLLC

(57) ABSTRACT

In order to speed up the search for a data item in a content addressable memory and to simplify the circuit structure of the memory having associated with each row of cells a ground control line, a ground line, a match control line, and with every row of cells there is associated a search activation terminal and a match indication terminal; a method of controlling the storage and retrieval of data in the memory utilizing a unique comparison strategy for determining when the content of a comparison register is found in the memory.

21 Claims, 3 Drawing Sheets

NON-VOLATILE AND-TYPE CONTENT ADDRESSABLE MEMORY

CROSS-REFERENCE TO RELATED APPLICATION

This application is a divisional of U.S. patent application Ser. No. 10/676,731, entitled, "NON-VOLATILE AND TYPE CONTENT ADDRESSABLE MEMORY" filed on Oct. 1, 2003, now U.S. Pat. No. 7,031,177, which is herein by this reference.

BACKGROUND OF THE INVENTION

1. Field of the Invention

The present invention relates to semiconductor memories and, more particularly, a non-volatile content addressable memory (CAM).

2. Description of the Related Art

As is known, semiconductor memories, such as used in microprocessors, personal computers, ASIC's, and the like, consist of a large number of cells arranged in rows and columns to form a cell matrix. Each cell contains a binary information element (bit) and to each row of the matrix there corresponds a binary word whose length depends on the number of columns.

At present the most widely used memories are the static or dynamic RAMs (Random Access Memories) in which the word memorized in a row of the matrix can be accessed by simply furnishing its address. In the case of a CAM cell matrix, on the other hand, a binary word stored in a row can be searched by inserting the word to be found in a comparison register associated with the matrix and comparing the content of the comparison register with the content of each row. The result of the search is made available by means of the observation of the voltage of a match line common to all the cells of a row. In a cell matrix, obviously, this operation is carried out simultaneously for all the binary words of each row. In other words, a content addressable memory is accessed by means of a comparison with its specific content rather than by means of a specific address.

There exist both volatile CAM cells and non-volatile CAM cells. The volatile CAM cells were initially developed from static RAM cells (SRAM) by simply adding transistors in such a manner as to provide an output connected to a match line. More recently, dynamic RAM cells (DRAM) have also been used as basic cells to obtain advantages in terms of area and cost.

CAM cells, irrespective of whether they are made with SRAMs or DRAMs, are relatively fast, but their binary content is lost as soon as the supply voltage is switched off. They therefore have to be rewritten at every new start-up by using a separate non-volatile memory unit, a hard disk for example. In CAMs of a non-volatile type, on the other hand, the data remain stored even when the voltage is cut off and, what is more, each cell calls for a smaller number of transistors and therefore a smaller silicon area than cells realized with SRAMs and DRAMs.

A known non-volatile content addressable memory cell 210, as described—for example—in U.S. Pat. No. 6,317,349 B1 and shown in FIG. 1 of the drawings attached hereto, comprises two transistors 211,212 of the floating-gate type that have their gate terminals connected to the same word line (WL) 220, their source terminals both connected to a match line (ML) 230 and their drain terminals each connected to one of the bit lines (BL, BL) 241,242. In general, any non-volatile memory element could take the place of the two transistors. A multiplicity of cells equal to the cell 210 of FIG. 1, ordered in rows and columns, forms a content addressable memory matrix, schematically represented in FIG. 2, where each row of cells comprises a pair of electric lines, respectively a word line 220 and a match line 230, and each column comprises two bit lines indicated by 241,242.

All the word lines 220 are connected to an external row control block 360, the match lines 230 have one of their ends connected to this same block 360, while at the other end they terminate in sense amplifiers 380. Pilot circuits 371 and 372 are coupled, respectively, with the bit lines 241 and 242 to bias them during the search, writing, and canceling operations. All the bit lines of the matrix lead to a block 370 that performs the function of register and control circuit for the search. The block 370 may contain a word for comparison purposes that is applied to its terminal indicated by DATA IN. The line control block 360 applies adequate voltages to the word lines and the match lines during the search, writing, and canceling operations by selecting one row of the cell matrix on the basis of an input signal ADRIN. The sense amplifiers 380 detect a voltage variation on the respective match lines 230 when the input word, contained in block 370, does not coincide with the word memorized in the corresponding row of the matrix.

The threshold voltage of the transistors 211,212 can be modified by acting on the terminals thereof to vary the electric charge of the respective floating-gates. The threshold voltage is "low" and determined by technological and design parameters when electrons are not accumulated in the floating-gate transistors and "high" when they are being accumulated. The high threshold voltage is fixed at a value greater than the supply voltage Vcc of the memory circuits (for example Vcc=5V), while the low voltage, as a general rule, is not greater than 1 V. Conventionally, when the threshold voltage of the transistor 211 is set high, while that of transistor 212 is set low, the elementary information stored in the cell 210 is a logic 1. When the thresholds are set in the opposite manner, a logic 0 is memorized. It is also possible to memorize a third state X, known as the don't care state, by programming the thresholds of both non-volatile elements to be high (>Vcc). The associative memories capable of memorizing these three states, rather than just the two basic logic states, are known as ternary memories. They are particularly advantageous in some applications.

Before undertaking the programming, the information content of the cell is cancelled by applying a sufficiently negative voltage to the word line 220 (for example, from −8V to −10V) and a positive voltage to the match line 230 (for example from 5V to 7V). The combination of these voltages on the gate and source terminals of the transistors 211,212 causes a tunnel effect capable of removing electrons from the floating gate of the transistor that has the high threshold voltage and thus reducing it to the low threshold voltage. This operation exerts an effect (of lesser entity) also on a transistor already set to a low threshold voltage. One therefore needs appropriate algorithms to re-program the cells that have had their thresholds excessively lowered and thus obtain a well controlled final value. The value of the voltage on the bit lines 241,242 does not exert any effect on the cancellation.

The operation of writing a CAM cell 210 is carried out by applying a high voltage to the word line 220 (for example, 8V) and setting the match line at ground voltage. When a logic 1 is to be memorized, the threshold of transistor 211 has to be stepped up, leaving the threshold of transistor 212 low, and an intermediate voltage (5V, for example) is applied to the bit line 241, leaving the other bit line 242 unconnected. To memorize a logic 0, on the other hand, one operates on the bit lines in the opposite manner to raise the threshold of transistor 212. When the don't care state X has to be memorized, the intermediate voltage is applied to both the bit lines 241 and 242.

The search operation in the cell 210 is performed by applying a supply voltage $V_{CC}$ to the word line 220, precharging the match line 230 with the voltage $V_{CC}$ and applying appropriate voltages to the bit lines 241,242. In particular, when the memorized data is a logic 1 (threshold of 211 high, threshold of 212 low) and the same bit is looked for in the cell, the bit line 241 is connected to ground, while the bit line 242 is connected to the supply voltage $V_{CC}$. In that case, since neither of the transistors 211,212 conducts, the voltage on the match line does not change, thus confirming that the stored bit matches the looked-for bit. When a logic 0 is being looked for, the bit lines have to be biased in the manner opposite to the previous case, so that this time it will be the transistor 212 that has the low threshold, conducts and therefore tends to reduce the voltage of the match line 230 to ground. When the memorized state is X, neither of the two transistors 211 and 212 can conduct and therefore the looked-for bit and the memorized bit will always coincide.

The operations that have just been described are carried out simultaneously in all the cells of each row of the matrix. When the word contained in block 370 is found in a row of the matrix, the voltage of the match line corresponding to that row does not vary and the sense amplifier 380 connected to that match line provides a signal to a priority encoding block 385 that generates an output signal ADROUT that identifies the position in the matrix of the word that corresponds to the looked-for word. Vice versa, when the two words differ by even a single bit, the amplifier 380 detects the voltage variation on the match line and no output signal is generated.

In the described memory matrix, the low threshold of the transistors 211,212 should be accurately controlled to assure that it will always be above a minimum predetermined value, 0.5 V for example. In this connection, let us now consider a matrix cell in which a bit is memorized (i.e., one of the transistors 211,212 has a low threshold). If this cell forms part of a row in which there is no match when the previously described search operation is carried out, the voltage of the corresponding match line will always tend to assume the ground voltage. During the search it may happen that the gate and drain terminals of one of the two transistors 211,212, the one with the low threshold, are at the voltage $V_{CC}$ and that the voltage difference between the gate terminal and the source terminal (connected to the match line) of the same transistor exceeds its threshold voltage when the potential of the match line approaches ground voltage. In that case the transistor under consideration will conduct a parasitic current that charges the match line and increases as the gate-source voltage becomes greater. If several cells in the same row conduct such parasitic currents, the voltage of the match line will not be sufficiently different from its initial pre-charge value (for example, $V_{CC}$), so that, in a limit case, it may become difficult to detect a non-match during the search. The effect of the parasitic currents can be neglected for the purposes of signal generation on the match line only when the low threshold voltage of the transistors 211,212 is greater than 0.5V. This sets some very restrictive constraints as far as the cancellation algorithm is concerned, which will have to become more and more accurate as the voltage applied to the word line diminishes. For example, a voltage of 1.8V on the word line would imply that all the low threshold voltages of all the cells would have to lie between 0.5V and 1V. There still remains the problem of dissipating the power due to the parasitic currents. The worst case occurs when there is a match condition for half the cells in a row and a non-match condition for the other half. The match line voltage comes down to a value intermediate between $V_{CC}$ and ground and a resistive path comes into being between the two potentials.

One should also consider the unfavorable, though not by any means unusual case in which during a search none of the cells of a column of the matrix produce a match, while all the other cells in the matrix are in a match condition; in that case the current passing through one of the bit lines associated with that column has to discharge the capacitances associated with all the match lines of the matrix. In every cell forming part of the column under consideration, indeed, one of the transistors 211 or 212, when conducting, will connect one of the bit lines, which is at ground potential, to the match line of the row that contains the cell that is at the voltage $V_{CC}$. The match lines to be discharged constitute a relatively high overall capacitive load (for example, 100 pF); in this particular case, therefore, the described matrix will need a relatively long time for carrying out the search operation.

When only one cell in a row of the described cell matrix is devoid of a match, the discharge of the match line associated with that row is slower than in the case where a match is lacking in several cells. With a view to speeding up the search operation and also to reduce the dissipation during the switching, the voltage excursion of the match line is reduced by making sure that the voltage of that line will not arrive at ground voltage (starting from the voltage $V_{CC}$), but rather at low value always greater than ground. This is obtained by using adequate voltage recovery circuits outside the memory matrix and connecting them to the match line during the search. However, the addition of the recovery circuits complicates the circuit structure of the known memory described above.

BRIEF SUMMARY OF THE INVENTION

The disclosed embodiments of the present invention resolve the problems of the known content addressable memory described hereinabove and, more particularly, avoid the limitations imposed on the low threshold voltage of the transistors in order to simplify the cancellation algorithm, render the search operation more rapid, and simplify the circuit structure of the memory.

A method of operating a non-volatile content addressable memory is provided that includes a multiplicity of memory cells ordered into a matrix of rows and columns, a word line (WL) associated with every row of cells and a first (BLR) and a second (BLL) bit line associated with every column of cells. Every cell has a first non-volatile memory element (F1) having a control terminal connected to the word line (WL) associated with the row containing the cell, a first terminal connected to the first bit line (BLR) associated with the column containing the cell and a second terminal connected to a match node (MG) of the cell and a second non-volatile memory element (F2) having a control terminal connected to the word line (WL) associated with the row containing the cell, a first terminal connected to the second bit line (BLL) associated with the column containing the cell and a second terminal connected to the match node (MG) of the cell.

In order to speed up the search for a data item in the memory and simplify the circuit structure of the memory, with each row of cells there is associated a ground control line (GNDCTRL), a ground line (GL) and a match control line (MLCTRL). Furthermore, with every row of cells there is associated a search activation terminal (SF) and a match indication terminal (MPin). Each cell comprises an input terminal (MLIN), an output terminal (MLOUT), a first controlled electronic switch (MO) connected between the input terminal (MLIN) and the output terminal (MLOUT) of the cell and having a control terminal connected to the match node (MG) of the cell, a second controlled electronic switch (Ml) connected between the ground line (GL) associated with the row containing the cell and the output terminal (MLOUT) of the cell and having a control terminal connected to the match control line (MLCTRL) associated with the row containing the cell and a third controlled electronic switch (M2) connected between the match node (MG) of the cell and the ground line (GL) associated with the row containing the cell and having a control terminal connected to the ground control line (GNDCTRL) associated with the row containing the cell.

In accordance with another embodiment of the invention, a method of carrying out the search for a binary word stored in a content addressable memory is provided. The method includes the following operations:

associating an element of a comparison register with each column of the matrix;

inserting in the register a word that is to be searched;

comparing the content of the register bit by bit with the content of every row, carrying out the following operations for each row:

applying a first pre-determined voltage to the ground line;

applying a second pre-determined voltage to the word line;

applying to the ground control line a third pre-determined voltage sufficient to close the electronic switch M2 and to discharge the match node of the cells of the row and immediately afterwards applying the first pre-determined voltage to the same ground control line;

applying to the match control line a fourth pre-determined voltage sufficient to close the electronic switch M1 and to discharge the output terminals of the cells of the row and immediately afterwards applying the first pre-determined voltage to the same match control line;

applying a fifth pre-determined voltage to the search activation terminal;

subsequently biasing the bit lines of every column by applying a pre-determined search voltage to the first or the second bit line according to whether the respective bit of the comparison register is in a first or a second logic state;

monitoring the voltage of the match indication terminal; and generating a match signal whenever the voltage on the match indication terminal varies or a no-match signal when the voltage on the match indication terminal does not vary.

In accordance with another embodiment of the invention, a method for searching a binary word stored in a content addressable memory is provided. The method includes a plurality of memory cells ordered into a matrix of rows and columns, and having an input terminal, an output terminal, first and second bit lines associated with every column of cells, and a word line, a ground control line, a ground line, a match control line, a search activation terminal, and a match indication terminal associated with every row of cells.

The method includes:

coupling an element of a comparison register with each column of the matrix of memory cells;

storing in the comparison register a word to be searched;

comparing the content of the comparison register bit by bit with the content of every row of memory cells in the matrix of memory cells by carrying out the following operations for each row:

applying a first pre-determined voltage to the ground line;

applying a second pre-determined voltage to the word line;

applying a third pre-determined voltage to the ground control line, the third pre-determined voltage set at a level to close an electronic switch and to discharge a match node of the cells of the row and immediately afterward applying the first pre-determined voltage to the ground control line;

applying to the match control line a fourth pre-determined voltage sufficient to close a first electronic switch and to discharge the output terminals of the cells of the row and immediately afterward applying the first pre-determined voltage to the same match control line;

applying a fifth pre-determined voltage to the search activation terminal;

subsequently biasing the bit lines of every column by applying a pre-determined search voltage to the first or the second bit line according to whether the respective bit of the comparison register is in a first or a second logic state;

monitoring the voltage of the match indication terminal; and generating a match signal when a voltage on the match indication terminal varies and generating a no-match signal when a voltage on the match indication terminal does not vary.

In accordance with another embodiment of the invention, a method of searching for a binary word stored in a content addressable memory having a plurality of non-volatile memory cells ordered into a matrix of rows and columns, and having an input terminal, an output terminal, first and second bit lines associated with every column of cells, and a word line, a ground control line, a ground line, a match control line, a search activation terminal, and a match indication terminal associated with every row of cells is provided. The method includes the operations of canceling the content of the memory cells; applying a high voltage to the word line; setting a ground control line high and a ground line to a ground potential; for storing a logic 1, applying an intermediate voltage to a first bit line and no voltage to a second bit line; for storing a logic 0, applying an intermediate voltage to the second bit line and no voltage to the first bit line; and for a don't care condition, applying a low voltage to both the first and second bit lines.

In accordance with another aspect of the foregoing embodiment, the method includes the step of canceling the content of the cells, which further includes the operations of applying a high voltage to a substrate of the memory cells; applying a negative voltage to the word line; and connecting the ground control line and the match control line to a ground potential.

In accordance with another aspect of the foregoing embodiment, the method includes searching for stored logic 0 and logic 1 in the memory cells, which includes the operations of applying a ground potential to the ground line; applying a high voltage to the ground control line and the match control line; connecting the search activation terminal to an input terminal of the cells to be searched; applying an intermediate voltage to the search activation terminal; and applying voltages to the first and second bit lines to search for logic 0 and logic 1 states of the memory cells.

BRIEF DESCRIPTION OF THE SEVERAL VIEWS OF THE DRAWINGS

The present invention will be more clearly understood from the description about to be given of a particular embodiment thereof, which is given purely by way of example and is not to be considered limitative in any way, the description making reference to the attached drawings in which.

DETAILED DESCRIPTION OF THE INVENTION

Figure 3:
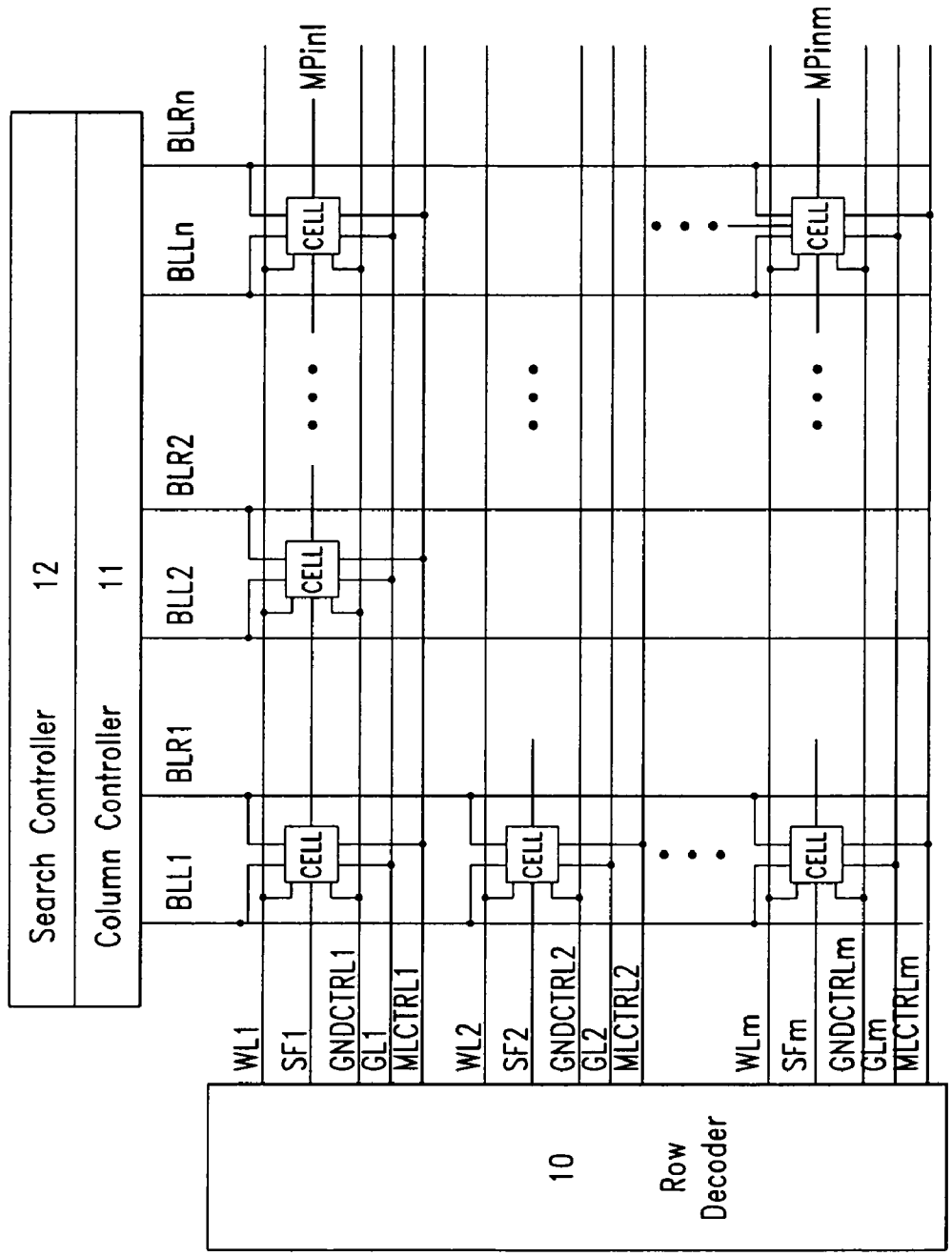
FIG. 3 shows a circuit diagram of a non-volatile content addressable memory in accordance with the invention.

As can be seen in FIG. 3, the memory in accordance with the invention comprises a multiplicity of cells CELL ordered in a matrix of m rows and n columns. Each row of the matrix includes four electric lines, respectively a word line WL1-m, a ground control line GNDCTRL1-m, a ground line GL1-m, and a match control line MLCTRL1-m, which are connected to a block 10 performing the function of row decoder. Furthermore, the memory includes search activation terminals SF1-m connected to the input of each row of cells and to block 10 and match indication terminals Mpin1-m connected to the output of each row of cells and to sense amplifiers (not shown). Each column includes two lines, a right-hand bit line BLR1-n and a left-hand bit line BLL1-n, connected to a block 11 performing the function of column decoder and a block 12 performing the function of controlling the search operation. All the cells in the same row are connected to the four lines associated with the row and all the cells in the same column are connected to the two lines associated with the column.

Figure 4:
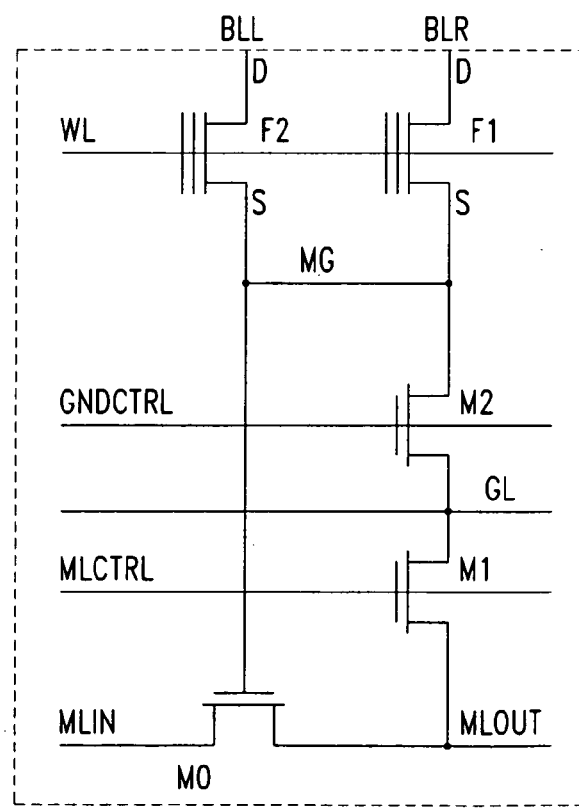
FIG. 4 shows a circuit diagram of a non-volatile CAM cell in accordance with the invention.

As can be seen from the circuit diagram of FIG. 4, each cell includes five transistors: two floating-gate type transistors F1 and F2 that function as non-volatile memory elements and three transistors M0, M1 and M2 that act as electronic switches. The two transistors F1 and F2 have their source terminals connected to a common electric terminal MG that will henceforth be referred to as a match node, their gate control terminals both connected to a word line WL and their drain terminals connected, respectively, to a right-hand bit line BLR and left-hand bit line BLL. The transistor M0 of each cell has its gate terminal connected to the match node MG and its source-drain section connected between an input terminal MLIN and an output terminal MLOUT of the cell. The transistor M1 has its gate terminal connected to a match control line MLCTRL and its source-drain section connected between a ground line GL and the output terminal MLOUT. The transistor M2 has its gate terminal connected to a ground control line GNDCTRL and the source-drain section connected between the match node MG and the ground line GL.

The transistors M0 belonging to cells of a same row are connected in series to each other in such a way that the output terminal (MLOUT) of each cell (excluding the last) is connected to the input terminal (MLIN) of the next cell of the row and the input terminal of each cell (excluding the first) is connected to the output terminal (MLOUT) of the previous cell of the row. The input terminal (MLIN) of the first cell of each row is connected to the search activation terminal (SF) of the row and the output terminal (MLOUT) of the last cell of each row is connected to the match indication terminal (MPin) of the row.

In each cell, similarly to the case of U.S. Pat. No. 6,317,349 B1, when a low threshold is fixed for F2 (for example, 1V) and a high threshold for F1 (for example, 5.5V), a logic 0 is memorized, while a logic 1 is memorized when the thresholds are set in the opposite manner. When both threshold are programmed with a low value, the don't care state X is memorized. The proposed cell therefore also constitutes a ternary content addressable memory.

To write a bit into a CAM cell like the one of FIG. 4 that has already been cancelled (transistors F1 and F2 with low thresholds), a high voltage is first applied to the word line WL (for example, from 5V to 8V). If the voltage of the ground control line GNDCTRL is set at a high value (for example, 5V to 8V) and the ground line GL is maintained at ground potential, thus enabling transistor M2 to conduct, the match node MG will likewise be connected to ground potential. To memorize a logic 1, an intermediate voltage is applied to the left-hand bit line, leaving the right-hand bit line BLR unconnected. Therefore the threshold of transistor F2 increases and the threshold of transistor F1 remains low. When a logic 0 is to be memorized, one acts in the opposite manner on the bit lines to step up the threshold of transistor F1. A low voltage remains on both the bit lines when the don't care state X is to be memorized.

When a bit in the cell is to be cancelled, the substrate of the transistors F1, F2, common to all the cells, is fixed at a high voltage (for example, 8V), a negative voltage is applied to the word line WL (for example, from −7V to −9V) and the ground control line GNDCTRL and match control line MLCTRL are connected to ground, leaving the other lines unconnected. In this way the electrons are removed from the floating gate of the transistor of the pair F1,F2 that has the high threshold, while the threshold of the other is altered to a far lesser extent.

With a view to describing the search operation, matters can be simplified by analyzing the functioning of a cell forming part of the first column of the matrix shown in FIG. 3 (all the cells of the matrix function in a similar manner). In this cell, ground potential ($V_{GL}$) is initially applied to the ground line GL, while a sufficiently high voltage (for example, from 5V to 8V) is applied to the ground control line GNDCTRL and the match control line MLCTRL in order to cause the transistors M2 and M1 to conduct; the node MG and the output terminal MLOUT will thus become discharged and assume the voltage of the line GL, i.e., ground potential. Furthermore, the block 10 applies a voltage $V_{SF}$ (comprised between 0.5V and the supply voltage of the integrated circuit of which the memory forms part, for example, from 1.8V to 3V) to the search activation terminal SF of the row in which the cell is situated: in this particular case, the search activation terminal SF is connected to the input terminal MLIN of the cell under consideration.

It is assumed that this cell stores a logic 0 (F2 with low threshold, F1 with high threshold). When the bit to be sought in the cell is a 1, a voltage $V_{SEARCH}$ (for example, from 1.2 to 2V) is applied to the right-hand bit line BLR and the left-hand bit line BLL is left unconnected. Setting an appropriate voltage, greater than the low threshold voltage of the transistors F1 and F2, (for example, 4V) on the word line WL and applying ground potential to the ground control line GNDCTRL and the match control line MLCTRL in order to shut down the transistors M2 and M1, neither of the transistors F1 and F2 will conduct, the match node MG is not charged, and the transistor M0 remains off. Consequently, the voltage $V_{SF}$ applied to the input terminal MLIN cannot become transferred to the output terminal MLOUT. The stored bit does not match the bit that is being sought and is therefore a 0. Vice versa, when the looked-for bit is a 0, the same voltage $V_{SEARCH}$ is applied to the left-hand bit line BLL, leaving the right-hand bit line BLR unconnected. In that case transistor F1 remains off, while transistor F2 conducts and causes the voltage of the internal node MG to increase to the value $V_{SEARCH}$. This voltage causes the switching on of the transistor M0; consequently, the node MLIN becomes connected to the node MLOUT and the voltage $V_{SF}$ becomes transferred. The stored bit matches the bit that is being sought and is therefore a 0.

Referring to the cell matrix shown in FIG. 3, during the search for a binary word stored in a register contained in block 12, block 11 applies the voltage $V_{SEARCH}$, which it receives from a regulator (not shown), to one of the bit lines of each of the n pairs (leaving the other bit line unconnected), while block 10 sets the voltages on the word lines WL1-m, the ground lines GL1-m, the ground control lines GNDCTRL1-m, and the match control lines MLCTRL1-m of each of the m rows. The block 10 also sets the voltage $V_{SF}$ on the search activation terminals SF1-m of the m rows. The voltages considered so far are in practice voltage pulses of predetermined duration which are applied to the electrical lines of the cell matrix, both to the rows and the columns, in predetermined times by an appropriate clock signal. In particular, the voltage $V_{SF}$ applied to the search activation terminals SF1-m is a voltage pulse. When there is a match between the word memorized in a row and the word that is being looked for, this voltage pulse becomes transferred from the first to the last cell of the row, i.e., from the search activation terminal to the match indication terminal, where it is detected by a sense amplifier. However, the array of transistors M0 of each row, besides to reduce the pulse amplitude, modifies the pulse leading edge by reducing its slope.

When the number of cells in each row is particularly high, the above mentioned effect can become heavy and the leading edge is flattened until it cannot be detected with certainty by the sense amplifier. In this case, in certain applications it may be advisable to introduce one or more buffers at regular intervals in the series connection of transistors M0 of the same row in order to restore the slope of the leading edge of the pulse. When the word memorized in the row does not match the looked-for word by even a single bit, the voltage $V_{SF}$ cannot become transferred and therefore the amplifier does not detect any voltage variations. When the state memorized in a cell of the row is the don't care state X, the two transistors F1 and F2 of the cell conduct, the voltage $V_{SF}$ becomes transferred, and there will thus always be a match. The voltage on the node MG and the output terminal MLOUT is discharged at the end of each search operation, thus re-activating the transistors M2 and M1.

The above description of the memory makes it clear that the transistors M0 forming part of cells that are situated in the same row of the matrix are connected in series with each other. Bearing in mind both this circuit arrangement and the functioning of the cells during the search, each row of the matrix performs during the search the logic function of an AND gate that has the n MG nodes as its inputs and the match line indication terminal MPIN as its output. In fact, if the voltages that can be assumed by the node MG of each cell, i.e., the voltage $V_{SEARCH}$ (when there is a match) and ground potential (when there is no match), are interpreted, respectively, as logic 1 and logic 0 and the states of variation of the voltage and non-variation of the voltage of the terminal MPin are interpreted, respectively, as logic 1 and logic 0, a logic 1 on the output side of the gate will be obtained only when all the inputs are 1, according to the logic of an AND-gate. For this reason, the memory in question can be called an AND-type content addressable memory.

During the search the match node MG of each individual cell is not connected to the match nodes MG of the cells situated on other columns, but by means of the bit lines BLR and BLL is connected only to the match nodes MG of any cells in a matching state forming part of the same column.

Figure 2:
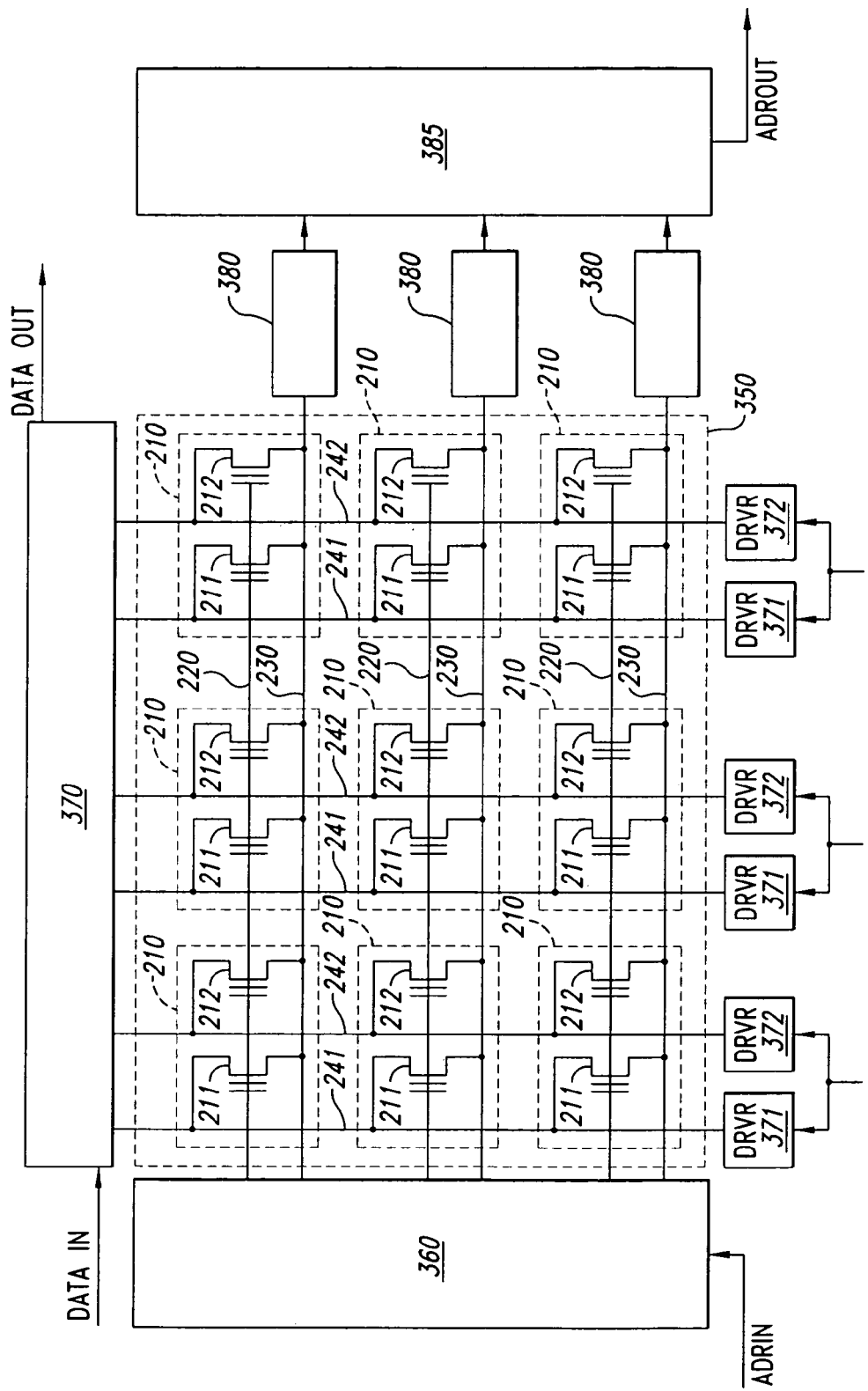
FIG. 2 shows a circuit diagram of a non-volatile content addressable memory comprising a matrix of cells like the one of FIG. 1.

It is easy to note that the present disclosed embodiment of the invention has numerous advantages as compared with the prior art. In particular, in the unfavorable case, in which all the cells of a matrix column according to FIG. 3 are in a matching state, that is equivalent to the case considered in connection with U.S. Pat. No. 6,317,349 B1, in which all the cells of a matrix column are in the non-matching state, the currents in the bit lines will charge only the nodes MG of the cells on the same column, so that they will charge an overall capacitance having a much smaller value than the capacitances that have to be discharged—all other conditions being identical—in the case of the memory of FIG. 2, i.e., the capacitances associated with all the match lines of the matrix.

Figure 1:
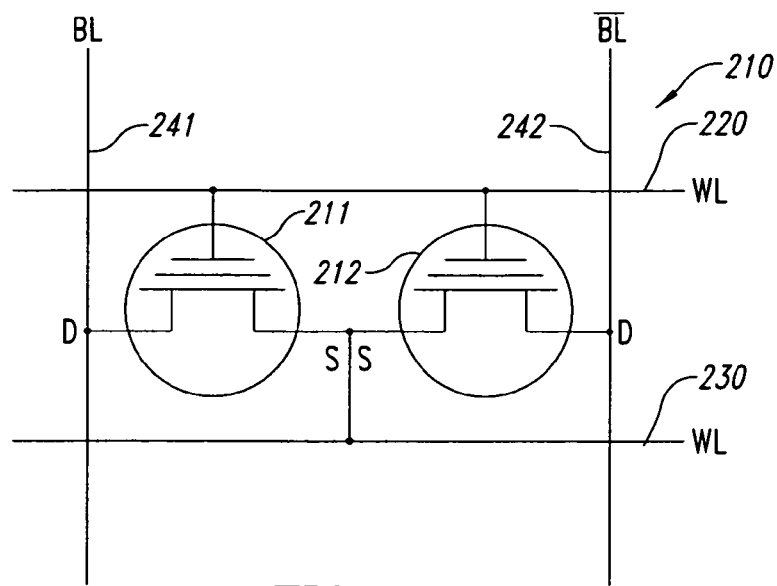
FIG. 1 shows a circuit diagram of a known non-volatile CAM cell.

According to the invention, the source terminals of the transistors F1 and F2 of every cell (coinciding with the respective nodes MG) are not directly connected to the match line, i.e., to the line that provides the series connection for the transistors M0 and corresponds to the match line ML of FIG. 1. When a logic 1 or a logic 0 is memorized in a row (all the cells with at least one of F1 and F2 having a high threshold), parasitic currents cannot be produced. These currents are generated only in rows of which the content has been cancelled (F1 and F2 with a low threshold) and can be eliminated by bringing the corresponding word lines to a low voltage (for example, from ground potential to −2V). In each case the parasitic currents will—at the very worst—charge the MG node and not the respective match line. Consequently, erroneous non-match valuations are avoided, the search is completed more rapidly, and the low threshold of F1,F2 does not have to be accurately controlled, thus simplifying the cancellation algorithm.

Although only a single embodiment of the present invention has here been illustrated and described, it is clear that numerous variants and modifications are possible without overstepping the inventive concept. For example, the block 11 could be designed in such a way that during the search the bit lines of every column are biased to, respectively, a voltage of $V_{SEARCH}$ and ground potential rather than one at the voltage $V_{SEARCH}$ and the other without any potential (because left unconnected or connected to a high-impedance terminal). In this way one avoids having to use a three-state device for biasing each pair of bit lines that would otherwise be necessary in order to have a high-impedance state. Furthermore, the initial value of the voltage of the MG node needs not be set to ground potential, but could be a positive voltage (1.8V, for example). In that case the voltage $V_{SEARCH}$ (which charges this node when there is a match) has to be higher, but one obtains the advantage of reducing the voltage excursion of the node MG and the dissipations associated therewith. Lastly, at the beginning of the search the voltage of the output terminal MLOUT of each cell can be set to a pre-charge value of 1.8V (rather than ground potential). In that case the negative voltage $V_{SF}$ is applied to the search activation terminal to drive transistor M0 correctly and, this time, a pulse is transferred with trailing edge.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of carrying out the search for a binary word stored in a content addressable memory comprising the following operations:
    associating an element of a comparison register with each column of the matrix;
    inserting in the register a word that is to be searched;
    comparing the content of the register bit by bit with the content of memory cells in every row by carrying out the following operations for each row:
        applying a first pre-determined voltage to a ground line;
        applying a second pre-determined voltage to a word line;
        applying to a ground control line a third pre-determined voltage sufficient to close a first electronic switch and to discharge a match node of the cells of the row and immediately afterwards applying the first pre-determined voltage to the ground control line;
        applying to the match control line a fourth pre-determined voltage sufficient to close a second electronic switch and to discharge output terminals of the cells of the row and immediately afterwards applying the first pre-determined voltage to the match control line;
        applying a fifth pre-determined voltage to a search activation terminal;
        subsequently biasing first and second bit lines of every column by applying a pre-determined search voltage to the first or the second bit line according to whether the respective bit of the comparison register is in a first or a second logic state;
        monitoring the voltage of a match indication terminal; and
        generating a match signal whenever the voltage on the match indication terminal varies or a no-match signal when the voltage on the match indication terminal does not vary.

2. The method of claim 1 wherein in the operation of subsequently biasing the bit lines, the bit line to which the pre-determined search voltage is not applied is left unconnected.

3. The method of claim 1 wherein in the operation of subsequently biasing the bit lines, a reference voltage is applied to the bit line to which the pre-determined search voltage is not applied.

4. The method of claim 1 wherein
    the first pre-determined voltage applied to the ground line amounts to about 0V;
    the second pre-determined voltage applied to the word line amounts to about 4V;
    the third pre-determined voltage applied to the ground control line is comprised between 5V and 8V;
    the fourth pre-determined voltage applied to the match control line is comprised between 5V and 8V;
    the fifth pre-determined voltage applied to the search activation terminal is comprised between 0.5V and 3V; and
    the pre-determined search voltage is comprised between 1.2V and 2V.

5. The method of claim 1 wherein
    the first pre-determined voltage applied to the ground line amounts to about 1.8V;
    the second pre-determined voltage applied to the word line amounts to about 4V;
    the third pre-determined voltage applied to the ground control line is comprised between 5V and 8V;
    the fourth pre-determined voltage applied to the match control line is comprised between 5V and 8V;
    the fifth pre-determined voltage applied to the search activation terminal is comprised between 0V and a negative voltage; and
    the pre-determined search voltage is greater than the voltage applied to the ground line.

6. A method of searching for a binary word stored in a content addressable memory having a plurality of memory cells ordered into a matrix of rows and columns, and having an input terminal, an output terminal, first and second bit lines associated with every column of cells, and a word line, a ground control line, a ground line, a match control line, a search activation terminal, and a match indication terminal associated with every row of cells, the method comprising:
    coupling an element of a comparison register with each column of the matrix of memory cells;
    storing in the comparison register a word to be searched;
    comparing the content of the comparison register bit by bit with the content of every row of memory cells in the matrix of memory cells by carrying out the following operations for each row:
        applying a first pre-determined voltage to the ground line;
        applying a second pre-determined voltage to the word line;
        applying a third pre-determined voltage to the ground control line, the third pre-determined voltage set at a level to close an electronic switch and to discharge a match node of the cells of the row and immediately afterward applying the first pre-determined voltage to the ground control line;
        applying to the match control line a fourth pre-determined voltage sufficient to close a first electronic switch and to discharge the output terminals of the cells of the row and immediately afterward applying the first pre-determined voltage to the same match control line;
        applying a fifth pre-determined voltage to the search activation terminal;
        subsequently biasing the bit lines of every column by applying a pre-determined search voltage to the first or the second bit line according to whether the respective bit of the comparison register is in a first or a second logic state;
        monitoring the voltage of the match indication terminal; and
        generating a match signal when a voltage on the match indication terminal varies and generating a no-match signal when a voltage on the match indication terminal does not vary.

7. The method of claim 6 wherein in the operation of subsequently biasing the bit lines, the bit line to which the pre-determined search voltage is not applied is left unconnected.

8. The method of claim 6 wherein in the operation of subsequently biasing the bit lines, a reference voltage is applied to the bit line to which the pre-determined search voltage is not applied.

9. The method of claim 6 wherein
the first pre-determined voltage applied to the ground line amounts to about 0V;
the second pre-determined voltage applied to the word line amounts to about 4V;
the third pre-determined voltage applied to the ground control line is comprised between 5V and 8V;
the fourth pre-determined voltage applied to the match control line is comprised between 5V and 8V;
the fifth pre-determined voltage applied to the search activation terminal is comprised between 0.5V and 3V; and
the pre-determined search voltage is comprised between 1.2V and 2V.

10. The method of claim 6 wherein
the first pre-determined voltage applied to the ground line amounts to about 1.8V;
the second pre-determined voltage applied to the word line amounts to about 4V;
the third pre-determined voltage applied to the ground control line is comprised between 5V and 8V;
the fourth pre-determined voltage applied to the match control line is comprised between 5V and 8V;
the fifth pre-determined voltage applied to the search activation terminal is comprised between 0V and a negative voltage; and
the pre-determined search voltage is greater than the voltage applied to the ground line.

11. A method of searching for a binary word stored in a content addressable memory having a plurality of memory cells ordered into a matrix of rows and columns, and having an input terminal, an output terminal, first and second bit lines associated with every column of cells, and a word line, a ground control line, a ground line, a match control line, a search activation terminal, and a match indication terminal associated with every row of cells, the method comprising:
canceling the content of the memory cells;
applying a high voltage to the word line;
setting a ground control line to a high voltage and a ground line to a ground potential;
to store a logic 1, applying an intermediate voltage to a first bit line and no voltage to a second bit line;
for storing a logic 0, applying an intermediate voltage to the second bit line and no voltage to the first bit line; and
for a don't care condition, applying a low voltage to both the first and second bit lines.

12. The method of claim 11 wherein canceling the content of the memory cells comprises:
applying a high voltage to a substrate of the memory cells;
applying a negative voltage to the word line; and
connecting the ground control line and the match control line to a ground potential.

13. The method of claim 12, further comprising leaving the first and second bit lines, the ground line, and the search activation terminal unconnected when canceling content.

14. The method of claim 11, further comprising searching the content of the memory, comprising:
applying a ground potential to the ground line;
applying a high voltage to the ground control line and the match control line;
connecting the search activation terminal to an input terminal of the cells to be searched;
applying an intermediate voltage to the search activation terminal; and
applying voltages to the first and second bit lines to search for logic 0 and logic 1 states of the memory cells.

15. The method of claim 14, comprising:
searching for a logic 1 state by applying a search voltage to the second bit line and leaving the first bit line unconnected; and
applying a voltage greater than a threshold voltage of transistors in the memory cell to the word line and a ground potential to the ground control line and the match control line.

16. The method of claim 14, comprising searching for a logic 0 by applying a search voltage to the first bit line and leaving the second bit line unconnected; and
applying a voltage greater than a threshold voltage of transistors in the memory cell to the word line and ground potential to the ground control line and the match control line.

17. The method of claim 14 wherein the voltage applied to the word line comprises a pulse voltage.

18. The method of claim 14, further comprising initially applying a precharge voltage to an output terminal of the memory cells.

19. The method of claim 11 wherein after canceling content of the memory cells, storing a binary word in a search controller coupled to the first and second bit lines.

20. The method of claim 11 wherein voltages applied to the first and second bit lines are applied by a column controller.

21. The method of claim 11 wherein voltages applied to the ground line, the ground control line, the match control line, and the word line are applied by a row decoder unit.

* * * * *